(12) United States Patent
Fan et al.

(10) Patent No.: US 7,265,996 B2
(45) Date of Patent: Sep. 4, 2007

(54) RETAINING DEVICE FOR EXPANSION CARDS

(75) Inventors: Chen-Lu Fan, Tu-Chen (TW); Li-Ping Chen, Tu-Chen (TW); Kuo-Chih Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 355 days.

(21) Appl. No.: 10/982,280

(22) Filed: Nov. 5, 2004

(65) Prior Publication Data

US 2005/0122703 A1    Jun. 9, 2005

(30) Foreign Application Priority Data

Nov. 14, 2003    (TW) ............................... 92220191 U

(51) Int. Cl.
*H05K 7/12* (2006.01)

(52) U.S. Cl. ............... 361/801; 361/759; 361/747; 361/740; 361/726; 361/732; 312/223.2

(58) Field of Classification Search ............... 361/801, 361/732, 740, 759, 747, 726; 312/223.2, 312/223.3; 211/41.17

See application file for complete search history.

(56) References Cited

U.S. PATENT DOCUMENTS 5,835,346 A    11/1998    Albani et al.
6,118,668 A *  9/2000    Scholder et al. ............. 361/753
6,777,246 B2 * 8/2004    Lawrence et al. ........... 436/533
6,960,720 B2 * 11/2005   Wen-Lung .................... 174/50
6,999,321 B2 * 2/2006    Suekawa et al. ............. 361/740
7,054,160 B2 * 5/2006    Kim ........................... 361/754

* cited by examiner

*Primary Examiner*—Dean A. Reichard
*Assistant Examiner*—Dameon E. Levi
(74) *Attorney, Agent, or Firm*—Wei Te Chung

(57) ABSTRACT

A retaining device (10) for retaining expansion cards (20) in a chassis (300) includes a retaining member (100) and a locking member (200). An upper positioning protrusion (316) and a lower positioning protrusion (318) are formed on a bent plate (312) of the chassis. The locking member is pivotally attached to the bent plate. A pressing portion (216) is formed on an inner side of the locking member and a notch (206) is defined in an outer side of the locking member. A support portion (126) is formed on the retaining member corresponding to the pressing portion. When the upper positioning protrusion is matched with the notch, the retaining member is put into the chassis. The locking member is pressed until the lower positioning protrusion is matched with the notch, and thus the retaining member is secured to the chassis.

18 Claims, 5 Drawing Sheets

RETAINING DEVICE FOR EXPANSION CARDS

BACKGROUND OF THE INVENTION

1. Field of the Invention

The present invention relates to retaining devices, and particularly to a retaining device which can securely retain expansion cards in a computer chassis.

2. Description of the Prior Art

A computer typically includes a chassis that encloses circuit components, such as processors, memory chips, peripheral interface devices and other circuit elements. The core circuit components, such as the processors and the memory chips, are often mounted on a single printed circuit board, such as a motherboard. It is often desirable to provide the computer with expansion ports or slots for attaching additional printed circuit cards ("expansion cards") having additional capabilities.

In one conventional arrangement, the expansion slots are provided on the motherboard. One drawback with this approach is that the expansion slots occupy valuable space on the motherboard. And nowadays the trend of the computer enclosure is small and thin. So a new type of computer enclosure has a limited height that cannot accommodate an expansion card directly mounted on the motherboard. One approach to addressing this drawback is to attach an intermediate riser card to a single slot of the motherboard and attach a plurality of expansion cards to the riser card.

Such an arrangement for expansion card is disclosed in U.S. Pat. No. 5,835,346. A computer chassis is partitioned into first and second regions by a partition wall. A motherboard is positioned within the first region along a bottom wall of the chassis. A riser card abutting the partition wall vertically interfaces with the motherboard. A series of horizontal option card interfaces are located above each other on the riser card within the first region of the enclosure each for interfacing with a corresponding option card and to position the option cards horizontally over the motherboard. However, the riser card is inserted in the motherboard directly and the option cards are inserted in the riser cards and then mounted in a back wall of the enclosure. When the computer is moved to anther place or sustains external shocks, the riser cards and the option cards are prone to be loosed or detached from the motherboard and the riser cards, respectively.

BRIEF SUMMARY OF THE INVENTION

Accordingly, an object of the present invention is to provide a retaining device which can readily and securely attach expansion cards in a computer chassis.

To achieve the above-mentioned object, a retaining device in accordance with a preferred embodiment of the present invention comprises a chassis with a motherboard attached thereon, a locking member and a retaining member. The chassis comprises a side wall. A bent plate depends from a top end of the side wall. An upper positioning protrusion and a lower positioning protrusion are formed on the bent plate. The locking member is pivotally attached to the bent plate of the chassis. A pressing portion and a releasing portion are formed on an inner side of the locking member and a notch is defined in an outer side of the locking member. The retaining member comprises a top plane, a back plane bent downwardly from a side of the top plane, and a side plane bent downwardly from the top plane adjacent the back plane. A support portion and a stopping portion are formed on the side plane corresponding to the pressing portion and the releasing portion of the locking member respectively. A riser card is secured to the side plane and interfaces with the motherboard. An expansion card is secured onto the back plane in a vertical direction and interfaces with the riser card.

When the upper positioning protrusion is matched with the notch of the locking member, the retaining member is put into the chassis. The locking member is then pressed until the lower positioning protrusion is matched with the notch. And thus the retaining member is secured onto the chassis. When disassembly, the locking member is rotated upwardly and the releasing portion presses the stopping portion, thus the locking member is released from the chassis.

Other objects, advantages and novel features of the present invention will be drawn from the following detailed description of preferred embodiments of the present invention with the attached drawings, in which:

DETAILED DESCRIPTION OF THE INVENTION

Figure 1:
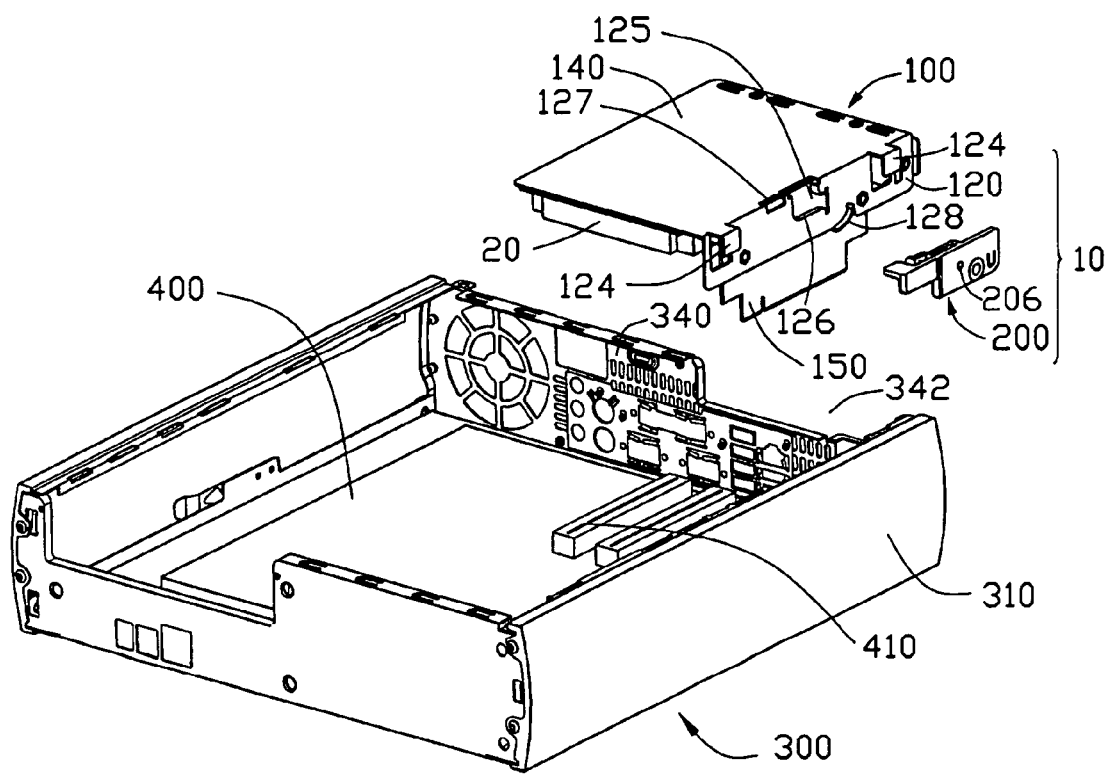
FIG. 1 is an exploded, isometric view of a retaining device in accordance with the preferred embodiment of the present invention, together with a computer chassis with a motherboard, the retaining device comprising a retaining member and a locking member, the retaining member secures a riser card and an expansion card.

Referring to FIG. 1, a retaining device 10 in accordance with the preferred embodiment of the present invention for retaining an expansion card 20 in a computer chassis 300 includes a retaining member 100, and a locking member 200. A riser card 150 and the expansion card 20 are to be attached to the retaining member 100.

Figure 2:
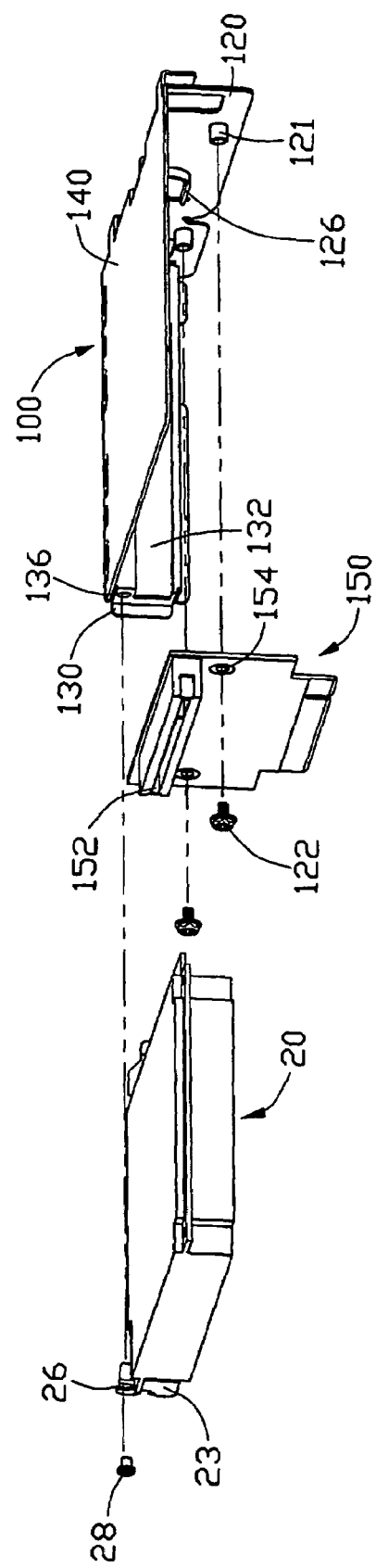
FIG. 2 is an exploded view of the retaining member, the riser card and the expansion card of FIG. 1.

Referring also to FIG. 2, a mounting tab 23 is fixed on a side of the expansion card 20 with a cutout 26 defined therein.

The retaining member 100 comprises a top plane 140, a back plane 130 bent vertically downwardly from a rear side of the top plane 140, and a side plane 120 bent vertically downwardly from the top plane 140 adjacent the back plane 130. A pair of bolts 121 spaced each other is formed on the side plane 120 for fastening the riser card 150 onto the side plane 120. A pair of L-shaped clips 124 extends from two sides of the top plane 140 respectively, and is then bent perpendicularly downwardly so as to be parallel to the side plane 120. An opening 125 is defined in the middle part of the side plane 120 and extends to a part of the top plane 140. A support portion 126 is bent inwardly from a bottom of the opening 125. An arc-shaped stopping portion 128 is formed outwardly from a bottom of the side plane 120 at one side of the opening 125. An accommodating hole 127 is defined in a junction of the top plane 140 and the side plane 120 at the other side of the opening 125. A slot 132 is defined in the back plane 130 for receiving the expansion card 20, and allowing the expansion card 20 to be interfaced by cables with corresponding external device. A screw hole 136 is defined in an end of the back plane 130 at a place corresponding to the cutout 26 of the expansion card 20. A screw 28 is used to secure the expansion card 20 to the back plane 130.

A plurality of screws 122 is used to pass through corresponding through apertures 154 of the riser card 150, and then engaged into the bolts 121 of the side plane 120, thus the riser card 150 is secured to the retaining member 100. An expansion connector 152 is secured on the riser card 150 to extend the expansion card 20 horizontally over the motherboard 400.

Figure 3:
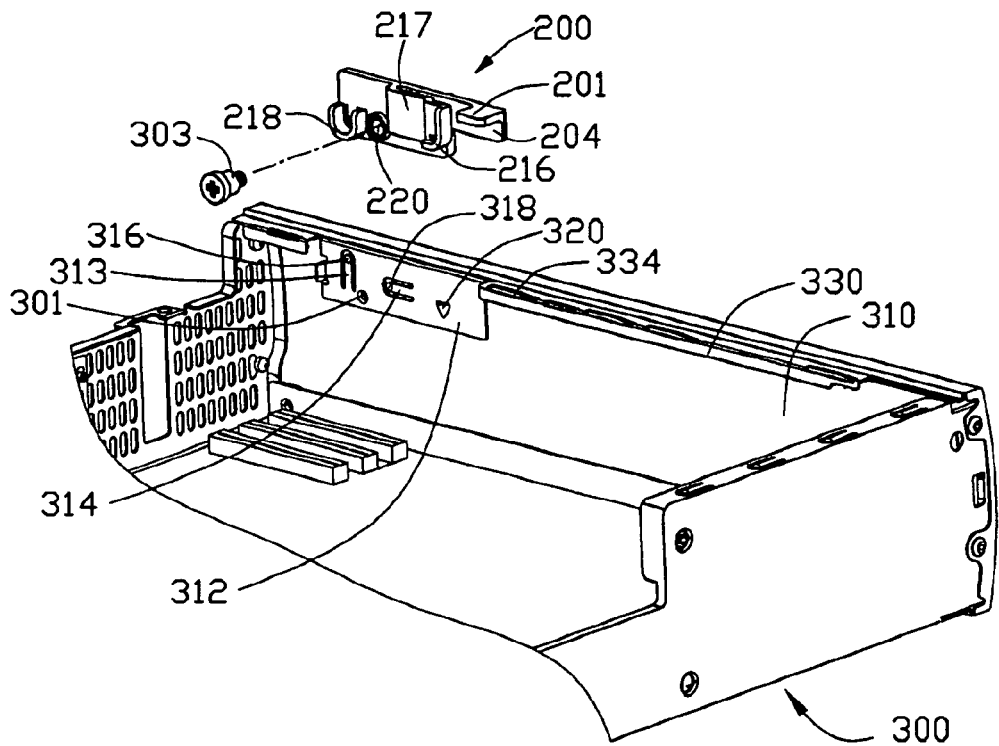
FIG. 3 shows the locking member and the computer chassis of FIG. 1 from another aspect.

Referring also to FIG. 3, a cantilever 204 extends outwardly from one end of the locking member 200. A handle 201 is bent perpendicularly inwardly from a top end of the cantilever 204 for lifting and pressing the locking member 200. A free end of the handle 201 can be accommodated in the accommodating hole 127 of the retaining member 100 when assembly finished. A U-shaped releasing portion 218 protrudes from a side of the locking member 200 corresponding to the stopping portion 128 of the retaining member 100. A through hole 220 is defined in the locking member 200. The locking member 200 further comprises a resilient arm 217 extending from a centre part of the locking member 200 toward the handle 201. An L-shaped pressing portion 216 is formed on a distal end of the resilient arm 217 corresponding to the support portion 126 of the retaining member 100. The locking member 200 further defines a notch 206 therein at a side opposite to the side on which the resilient arm 217 locates.

The chassis 300 comprises a bottom wall (not labeled), a side wall 310 extending upwardly from one side of the bottom wall, and a back wall 340 extending upwardly from a rear side of the bottom wall. The bottom wall has a motherboard 400 attached thereon. The motherboard 400 has a motherboard connector 410. The riser card 150 can be both physically and electrically coupled to the motherboard connector 410. The expansion card 20 is coupled to the motherboard 400 via the riser card 150. A bent plate 312 depends from a top flange of the side wall 310, and is parallel with the side wall 310. A screw aperture 301 is defined in the bent plate 312 corresponding to the through hole 220 of the locking member 200. A screw 303 is used to secure the locking member 200 to the chassis 300. The locking member 200 can rotate around the screw 303. A pair of spaced spring tabs 313, 314 is formed on the bent plate 312 with the same distance to the screw hole 301. The two spring tabs 313, 314 are perpendicularly to each other. An upper positioning protrusion 316 and a lower positioning protrusion 318 are formed on the distal ends of the two spring tabs 313, 314, respectively, for matching with the notch 206 of the locking member 200. A stopping nub 320 protrudes from the bent plate 312 at a place beside the lower positioning protrusion 318, corresponding to the cantilever 204 of the locking member 200, to prevent the locking member 200 from being over pressed. A pair of flanges 330 is bent inwardly from the side wall 310 at two opposite sides of the bent plate 312. A receiving slit 334 is defined in each flange 330 for receiving the clip 124 of the retaining member 100. A rectangular opening 342 is defined in the back wall 340 for accessing the expansion card 20.

Figure 4:
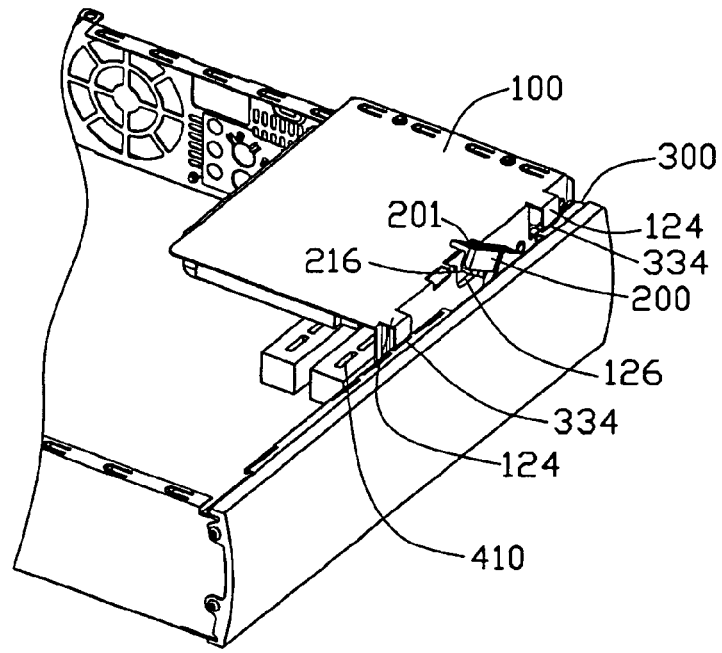
FIG. 4 is an assembled view of FIG. 1, showing the retaining device in an unlocked position.
Figure 5:
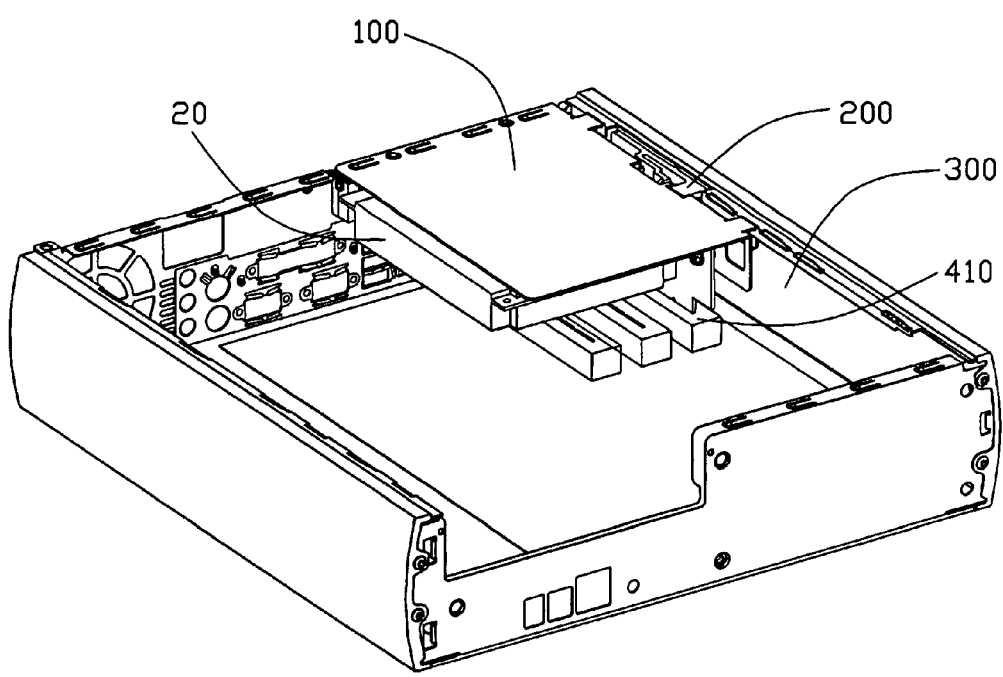
FIG. 5 is an assembled view of FIG. 1, showing the retaining device in a locked position.

Referring also to FIGS. 4 and 5, in assembly, the locking member 200 is rotatably attached to the bent plate 312 of the chassis 300 by the screw 303. The handle 201 of the locking member 200 is rotated upwardly until the upper positioning protrusion 316 of the chassis 300 is engaged in the notch 206 of the locking member 200. Thus the locking member 200 is positioned at a certain angle for preventing interfering with the retaining member 100 when assembling the retaining member 100. Then the retaining member 100 with the riser card 150 and the expansion card 20 mounted thereon is assembled into the chassis 300. The riser card 150 is preliminarily inserted in the motherboard connecter 410 of the motherboard 400, and the clips 124 of the retaining member 100 are in alignment with the receiving slits 334 of the chassis 300. Then the handle 201 is rotated downwardly with the pressing portion 216 continuously pressing the support portion 126 of the retaining member 100, until the clips 124 are engaged in the receiving slits 334. At the time, the cantilever 204 of the locking member 200 presses against the stopping nub 320 of the chassis 300. The lower positioning protrusion 318 is engaged in the notch 206 of the locking member 200, to prevent the locking member 200 from being rotated upwardly by accident.

Figure 6:
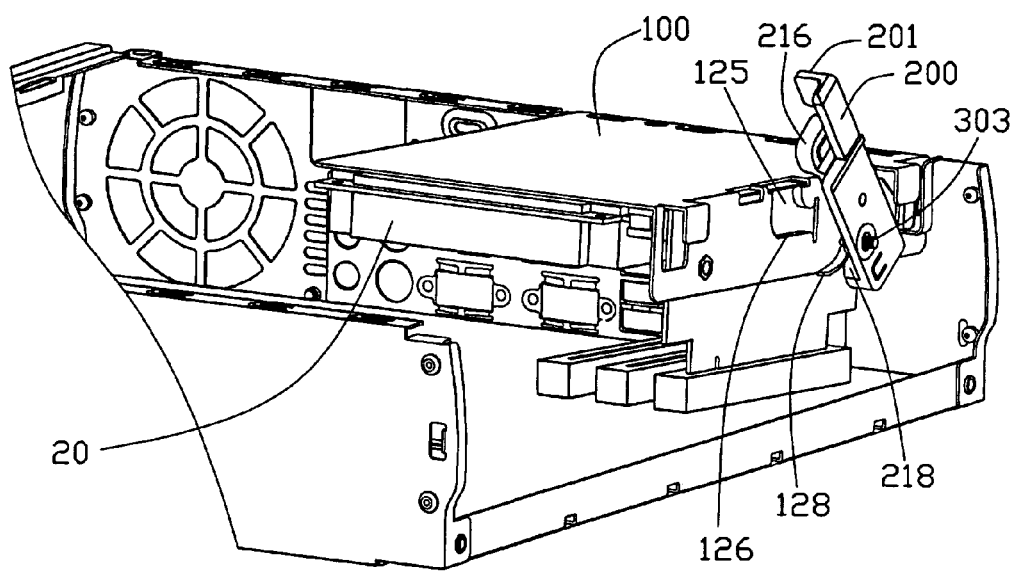
FIG. 6 is similar to FIG. 4, but having the chassis being partly taken off for better showing a disassembling process.

Referring to FIG. 6, in disassembly, the handle 201 of the locking member 200 is firstly rotated upwardly around the screw 303. After the handle 201 is rotated to a certain angle, the releasing portion 218 of the locking member 200 begins to continuously press the stopping portion 128 upwardly. The retaining member 100 is lifted, and disengaged from the chassis 300. Thus the retaining member 100 with the riser card 150 and the expansion card 20 mounted thereon can be easily taken away from the chassis 300.

Although only one expansion card 20 is included in the above description, the retaining device 10 of the present invention is equally capable of mounting a plurality of expansion cards.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A retaining device for securing an expansion card, the retaining device comprising:
   a chassis with a motherboard attached therein, the chassis comprising a side wall and a bent plate, the bent plate integrally extending from a top end of the side wall, a lower positioning section formed on the bent plate;
   a retaining member comprising a side plane, a support portion formed on the side plane;
   a riser card secured to the side plane of the retaining member, and interfacing with the motherboard, and
   a locking member pivotally attached to the wall of the chassis and pivotable with respect to the side wall about an axis which is stationary relative to the side wall, a pressing portion formed on an inner side of the locking member and a complementary positioning section defined in an outer side of the locking member, one of the lower positioning section and the complementary positioning section being deformable in a direction perpendicular to the bent plate;
   wherein the expansion card interfaces with the riser card and is mounted in the retaining member, the retaining member is then placed into the chassis, and the locking member is rotated downwardly with the pressing portion pressing against the support portion of the retaining member to retain the retaining member in the chassis, the lower positioning section engages with the complementary positioning section of the locking member to prevent the locking member from being rotated upward by accident.

2. The retaining device as claimed in claim 1, wherein a through hole is defined in the locking member, a screw aperture is defined in the bent plate of the chassis corresponding to the through hole, a screw extends through the through hole and engages in the screw aperture, the locking member is rotatable around the screw.

3. The retaining device as claimed in claim 1, wherein an upper positioning section is formed on the bent plate configured to engage with the complementary positioning section of the locking member when the locking member is rotated upward to a predetermined position.

4. The retaining device as claimed in claim 3, wherein a pair of spaced spring tabs is formed on the bent plate, an upper positioning protrusion and a lower positioning protrusion are formed on distal ends of the spring tabs respectively to constitute the upper positioning section and the lower positioning section, and a notch is defined in the outer side of the locking member to constitute the complementary positioning section.

5. The retaining device as claimed in claim 1, wherein a stopping portion forms outwardly from the side plane of the retaining member.

6. The retaining device as claimed in claim 5, wherein a releasing portion protrudes from an inner side of the locking member corresponding to the stopping portion, and wherein when the locking member is rotated upwardly, the releasing portion presses the stopping portion so as to drive the retaining member upwardly from the chassis.

7. The retaining device as claimed in claim 1, wherein an expansion connector is secured on the riser card to extend the expansion card horizontally over the motherboard.

8. The retaining device as claimed in claim 1, wherein a handle extends from one end of the locking member.

9. The retaining device as claimed in claim 8, wherein a stopping nub protrudes from the bent plate at a place preventing the handle of the locking member from further rotating downwardly.

10. The retaining device as claimed in claim 1, wherein a pair of clips is formed from the retaining member, a pair of receiving slits is defined in the side wall of the chassis and receives the clips.

11. A retaining device for expansion cards, the retaining device comprising:
a chassis comprising a side wall, a bent plate integrally extending from a top end of the side wall, an upper positioning protrusion and a lower positioning protrusion formed on the bent plate and being deformable in a direction perpendicular to the bent plate;
a motherboard attached on the chassis with a plurality of motherboard connector secured thereon;
a locking member pivotally attached to the bent plate of the chassis, a releasing portion formed on an inner side of the locking member and a notch defined in an outer side of the locking member; and
a retaining member attached to the side wall of the chassis, the retaining member comprising a side plane with a stopping portion formed thereon, a riser card secured to the side plane and interfacing with the motherboard, an expansion card interfacing with the riser card;
wherein when the upper positioning protrusion is matched with the notch of the locking member, the retaining member is put into the chassis, then the locking member is pressed downwardly so that the lower positioning protrusion is matched with the notch, the retaining member is thereby secured on the chassis, when the locking member is rotated upwardly and the releasing portion presses the stopping portion upwardly, thus the retaining member is released from the chassis.

12. The retaining device as claimed in claim 11, wherein the retaining member further comprises a support portion, the support portion is formed on the side plane, a pressing portion is formed on one side of the locking member corresponding to the support portion.

13. The retaining device as claimed in claim 11, wherein a cantilever extends outwardly from one end of the locking member, a stopping nub protrudes from the bent plate for preventing the cantilever from rotating too much into the chassis.

14. The retaining device as claimed in claim 11, wherein a pair of clips is formed from the retaining member, a pair of receiving slits is defined in the side wall of the chassis and receives the clips.

15. A retaining device assembly comprising:
a chassis defining a cavity to receive a mother board therein;
a mother board connector being mounted upon the mother board;
a locking member being moveably mounted to a wall of the chassis;
a retaining member moveably loaded into and unloaded from the cavity;
an expansion card attached to the retaining member and adapted to be connected to the mother board connector;
interengagement devices formed on both the retaining member and the locking member, said interengagement devices including a first section on the locking member to downwardly press a second section on the retaining member to pull the retaining member moving downwardly relative to the chassis for attaching the retaining member to the chassis, and a third section on the locking member to upwardly press a fourth section on the retaining member for detaching the retaining member from the chassis.

16. The retaining device assembly as claimed in claim 15, wherein said locking member is pivotally moved relative to the chassis.

17. The retaining device assembly as claimed in claim 16, wherein said retaining member is generally up and down moved relative to the chassis.

18. The retaining device assembly as claimed in claim 16, wherein the locking member is pivotable with respect to the chassis around an axis which is stationary relative to the wall of the chassis, the first and third sections being disposed at opposite sides of the axis.

* * * * *